(12) United States Patent
Terakado et al.

(10) Patent No.: US 6,595,400 B2
(45) Date of Patent: Jul. 22, 2003

(54) WIRE BONDING APPARATUS

(75) Inventors: Yoshimitsu Terakado, Hachioji (JP);
Tooru Mochida, Higashiyamato (JP);
Tatsunari Mii, Tachikawa (JP);
Shigeru Shiozawa, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 11 days.

(21) Appl. No.: 09/934,890

(22) Filed: Aug. 22, 2001

(65) Prior Publication Data

US 2002/0023942 A1 Feb. 28, 2002

(30) Foreign Application Priority Data

Aug. 22, 2000 (JP) ........................ 2000-250500

(51) Int. Cl.[7] ........................ B23K 37/00; B23K 31/02
(52) U.S. Cl. ........................ 228/4.5; 228/180.5
(58) Field of Search ........................ 228/1.1, 110.1, 228/4.5, 180.5

(56) References Cited

U.S. PATENT DOCUMENTS

| 4,053,096 A | * | 10/1977 | Heim |
| 5,176,310 A | * | 1/1993 | Akiyama et al. |
| 5,897,049 A | * | 4/1999 | Nakamura et al. |
| 5,981,371 A | * | 11/1999 | Yamazaki et al. |
| 2002/0023942 A1 | * | 2/2002 | Terakado et al. |

FOREIGN PATENT DOCUMENTS

| JP | 363003423 A | * | 1/1988 |
| JP | 401028929 A | * | 1/1989 |
| JP | 4042146644 A | * | 8/1992 |
| JP | H4-318943 | | 11/1992 |
| JP | H5-60657 | | 9/1993 |
| JP | 406268006 A | * | 9/1994 |
| JP | 2617541 | | 3/1997 |
| JP | 2841126 | | 10/1998 |
| JP | 411163028 A | * | 6/1999 |
| JP | 11284008 A | * | 10/1999 |
| JP | 411284008 A | * | 10/1999 |
| JP | 02002064118 A | * | 2/2002 |

OTHER PUBLICATIONS translation of JP 06–268006.*

* cited by examiner

*Primary Examiner*—Tom Dunn
*Assistant Examiner*—Kiley Stoner
(74) *Attorney, Agent, or Firm*—Koda & Androlia

(57) ABSTRACT

In a wire bonding apparatus in which a wire is passed through a capillary that is provided at one end of a bonding arm and a clamper that holds the wire is disposed directly above the capillary, the distance between the upper surface of the capillary and the undersurface of the clamper is set as a very short distance as 1.5 mm or less.

3 Claims, 3 Drawing Sheets

WIRE BONDING APPARATUS

BACKGROUND OF THE INVENTION

1. Field of the Invention

The present invention relates to a wire bonding apparatus.

2. Prior Art

Semiconductor device assembling includes, as shown in FIG. 3, a process that connects, by a wire 5, a first bonding point 3, which is on a semiconductor chip 2 bonded to a lead frame 1, and a second bonding point 4, which is on the lead frame 1.

In this process, after the wire 5 passing through a capillary 6 is connected (bonded) to the second bonding point 4 in step (a), a clamper 7 is opened and this clamper 7 is raised together with the capillary 6 while the wire 5 is released, thus delivering the wire 5 from the capillary 6 in step (b). Next, in step (c), the clamper 7 is closed, and the clamper 7 is raised further together with the capillary 6 with the wire being held by the clamper 7, thus in step (d) cutting the wire 5 from the second bonding point 4. As a result, a fixed length of wire (called a "tail") 5a is left in step (e) so as to extend from the tip end of the capillary 6.

In this process, since the shape and length of the tail 5a are the factors that affect the quality of a ball that is formed at the end of the tail 5a in the next wire bonding process, these parameters are extremely important in wire bonding.

The above-described wire bonding method is disclosed in, for instance, Japanese Patent Application Publication (Kokoku) No. H5-60657 (Laid-Open No. H630042135) and Japanese Patent Application Laid-Open (Kokai) No. H4-318943.

The above-described wire bonding method is performed by the wire bonding apparatus shown in FIG. 2.

In this bonding apparatus, a bonding head 11 is installed on an XY table 10 that is driven in X and Y directions on a horizontal plane. A raising-and-lowering mechanism 12 which is driven by a Z-axis motor (not shown) is installed on the bonding head 11 so that the raising-and-lowering mechanism 12 is moved up and down. A bonding arm 13, which has the capillary 6 at one end thereof, and a clamper supporting body 14 are fastened to the raising-and-lowering mechanism 12. The clamper 7 is mounted on the clamper supporting body 14 so that the clamper 7 is free to open and close.

Furthermore, a spool support (not shown) and a tension mechanism 21 are provided on the bonding head 11. The spool support holds a wire spool 20 around which the wire 5 is wound, and the tension mechanism 21 applies air tension to the wire 5. The wire 5 passes through the capillary 6 from the wire spool 20 via the tension mechanism 21 and clamper 7. The passage of this wire 5 is called the "wire path." In FIG. 2, the reference numeral 22 refers to guide rails that guide a lead frame 1.

The wire bonding apparatuses described above is shown in, for instance, Japanese Patent Nos. 2617541 (Laid-Open No. H2-122639) and 2841126 (H4-320350).

Conventionally, various methods have been used to stabilize the shape and length of the tail 5a. In the above-described Japanese Patent No. 2841126, for such a purpose the speed at which the capillary 6 and clamper 7 are raised when the wire is cut is set at a constant low speed. However, with these conventional methods, there are limits to the stabilization of the shape and length of the tail 5a. As a result of experiments conducted by the inventors of the present application with reference to the reasons of this problem, it was ascertained that the distance L (see step (a) in FIG. 3) that is between the capillary 6 and clamper 7 had something to do with the shape and length of the wire tail.

As described above, the capillary 6 and clamper 7 are raised together; and when the clamper 7 is closed during this rising motion to cut the wire 5 from the second bonding point 4, the wire 5 undergoes plastic deformation and as a result is cut. In this case, a rebound force is generated in the wire 5, and this force causes deformation in the wire 5. This wire deformation tends to occur between the clamper 7 and the capillary 6, where there is such a degree of freedom that the wire 5 is not constrained.

In a conventional wire bonding apparatus, the distance L between the wire insertion hole side of the capillary 6 and the clamper 7 is approximately 3 mm to 5 mm. Accordingly, when the wire is cut, the wire 5 is twisted and bent between the capillary 6 and the clamper 7; and the wire 5 is deformed as shown by wave-shaped line in step (e) in FIG. 3. When the wire 5 is thus deformed, the shape and length of the tail 5a are unstable, and the quality of the ball that is formed next will be unstable or not consistent. Furthermore, as a result of the deformation in the wire such as twisting, bending, etc. between the capillary 6 and clamper 7, the shape of the wire loop becomes unstable, and this would cause short-circuiting of the bonded wires or cause the wires to fall over during molding.

The above-described rebound of the wire during wire cutting will be described with reference to FIG. 4.

Step (a) in FIG. 4 shows the same state as step (c) in FIG. 3. In other words, in step (a), the capillary 6 and clamper 7 have risen together, and the clamper 7 has closed at an intermediate point during this rising movement so that the wire 5 is held by the clamper 7. When the capillary 6 and clamper 7 are raised further in step (b) in FIG. 4 from the position in step (a), the portion of the wire 5 that is between the bonded root 5b of the second bonding point 4 and the clamper 7 elongates, and the bonded root 5b undergoes plastic deformation. As a result, the wire 5 is cut. When the wire 5 is cut from the bonded root 5b, a rebound force is generated in the wire 5, and the elongated wire 5 extending from the clamper 7 to the lower end of the cut wire 5 tends to return to its original state as shown in step (c) or (d). Then, the wire is eventually deformed into an S shape or V shape in step (e) between the capillary 6 and clamper 7.

SUMMARY OF THE INVENTION

Accordingly, the object of the present invention is to provide a wire bonding apparatus that prevents deformation in the wire during wire cutting, so that the shape and length of the wire tail are stabilized, and the constant shape of the wire loop is obtained.

The above object is accomplished by a unique structure for a wire bonding apparatus in which a wire is passed through a capillary provided at one end of a bonding arm, and a clamper that clamps the wire is disposed directly above the capillary; and the unique structure of the present invention is that the distance between the upper surface of the capillary and the undersurface of the clamper is set so as to be very short.

More specifically, the distance between the upper surface of the capillary and the undersurface of the clamper is set to be 1.5 mm or less in the present invention.

DETAILED DESCRIPTION OF THE INVENTION

Figure 1:
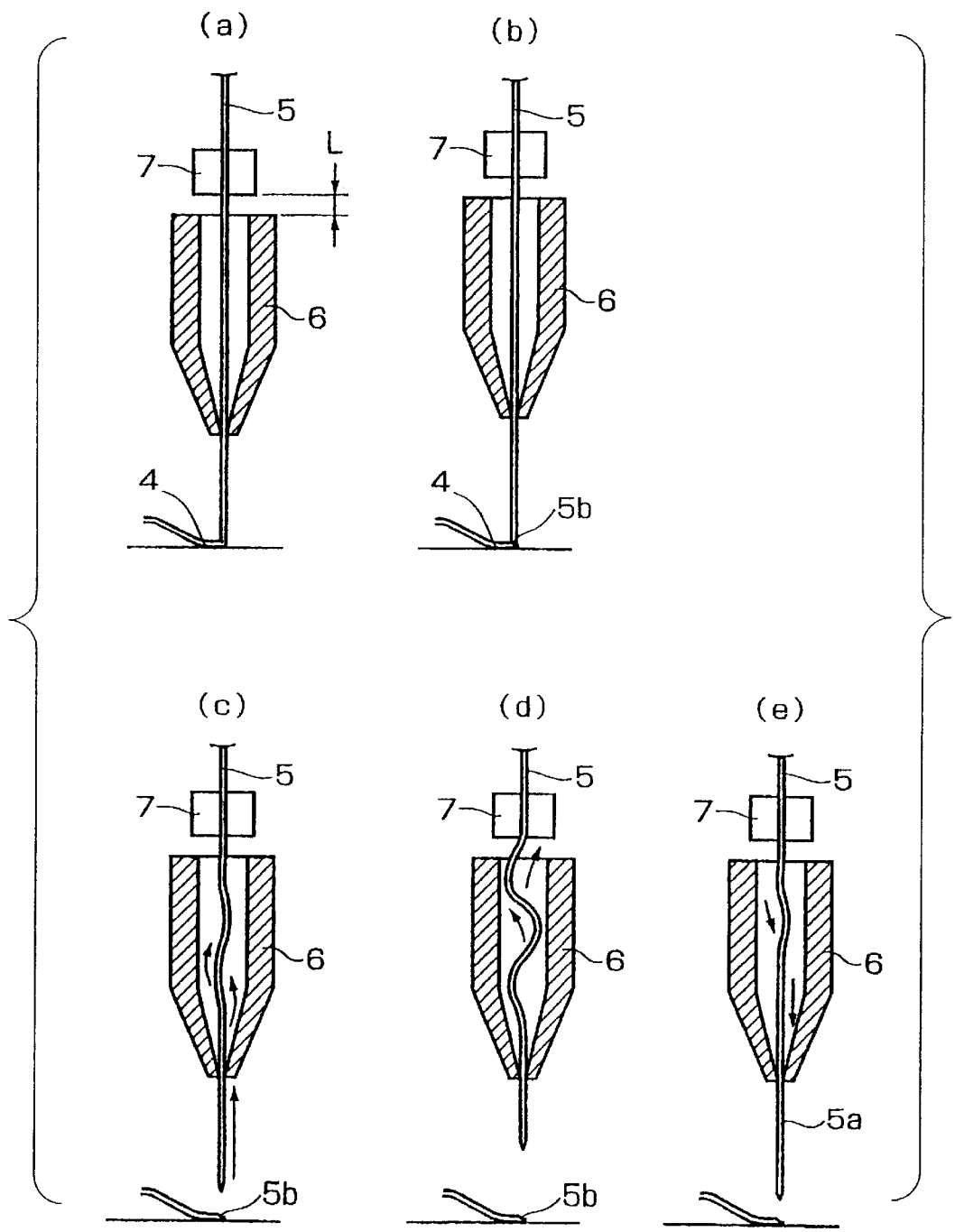
FIG. 1 is an explanatory diagram showing how the rebound of the wire occurs when the wire is cut in accordance with one embodiment of the wire bonding apparatus of the present invention.

One embodiment of the present invention will be described with reference to FIG. 1. In this description, elements that are the same as those in FIGS. 2 through 4 or elements that correspond to those in FIGS. 2 through 4 will be given the same reference numerals.

Figure 2:
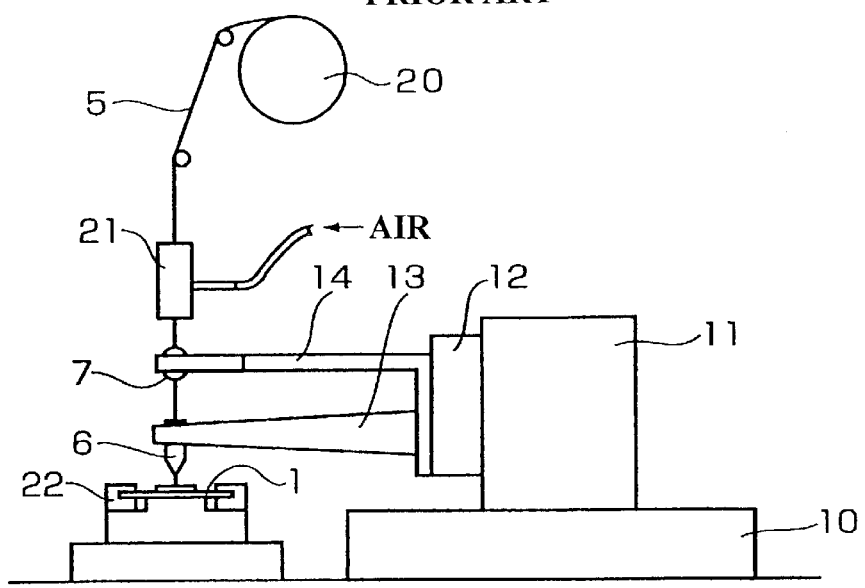
FIG. 2 is a side view of a prior art wire bonding apparatus.

As seen from FIG. 1, the clamper 7 is installed at a very short distance from the wire insertion hole (at the top surface) of the capillary 6. In regard to this very short distance, desirable results were obtained in the inventors' tests when the distance L from the upper surface of the capillary 6 to the undersurface of the clamper 7 was set at 1.5 mm or less. In particular, the most desirable results were obtained when the distance L was set in the range of 0.1 to 1.0 mm.

Figure 3:
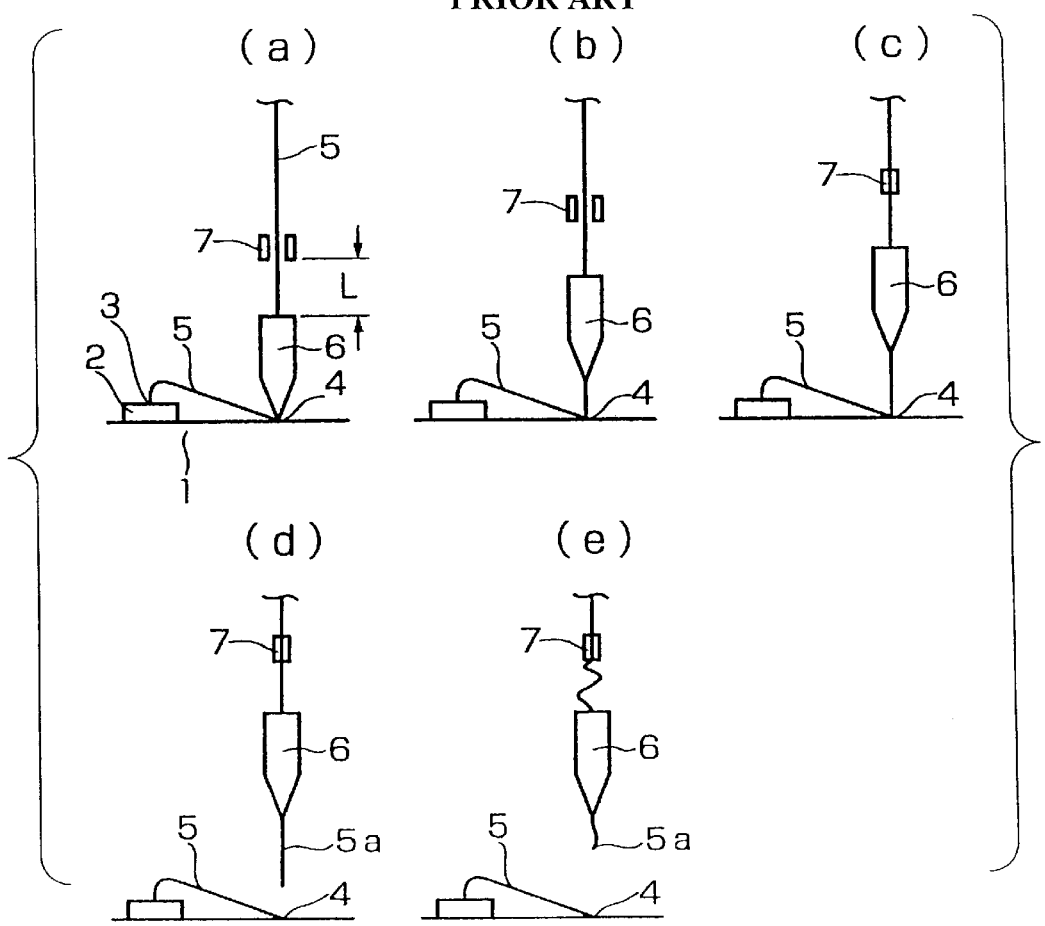
FIG. 3 is an explanatory diagram showing how the rebound of the wire occurs when the wire is cut in a conventional wire bonding apparatus.

With the setting as described above, as in the conventional method shown in FIG. 3, after the wire 5 passing through the capillary 6 is connected to the second bonding point 4 in step (a) in FIG. 3, the clamper 7 is opened thus releasing the wire 5. In step (b) with the clamper 7 opened, the clamper 7 is raised together with the capillary 6, thus delivering the wire 5. Next, in step (c), the clamper 7 is closed, and the clamper 7 is raised further together with the capillary 6 with the wire 5 held by the clamper 7. Consequently, in step (d), the wire 5 is cut from the second bonding point 4; and as a result, a tail 5a of a fixed length extends from the tip end of the capillary 6.

Thus, with the capillary 6 disposed at a distance of 1.5 mm or less from the clamper 7, the clamper 7 during the cutting of the wire will hold the wire 5 at a position that is closer to the second bonding point 4 than in the conventional bonding apparatus. In other words, the length of the wire 5 at the time that the wire is cut (i.e., the length from the second bonding point 4 to the position of the clamper 7 when the clamper 7 is closed) is shorter than in the conventional apparatus. As a result, the rebound force of the wire 5 at the time of wire cutting is reduced. Furthermore, since the distance between the capillary 6 and clamper 7 is almost nil, the area with a degree of freedom that allows deformation of the wire 5 is eliminated.

The above-described rebound of the wire that occurs when the wire is cut will be described with reference to FIG. 1.

Figure 4:
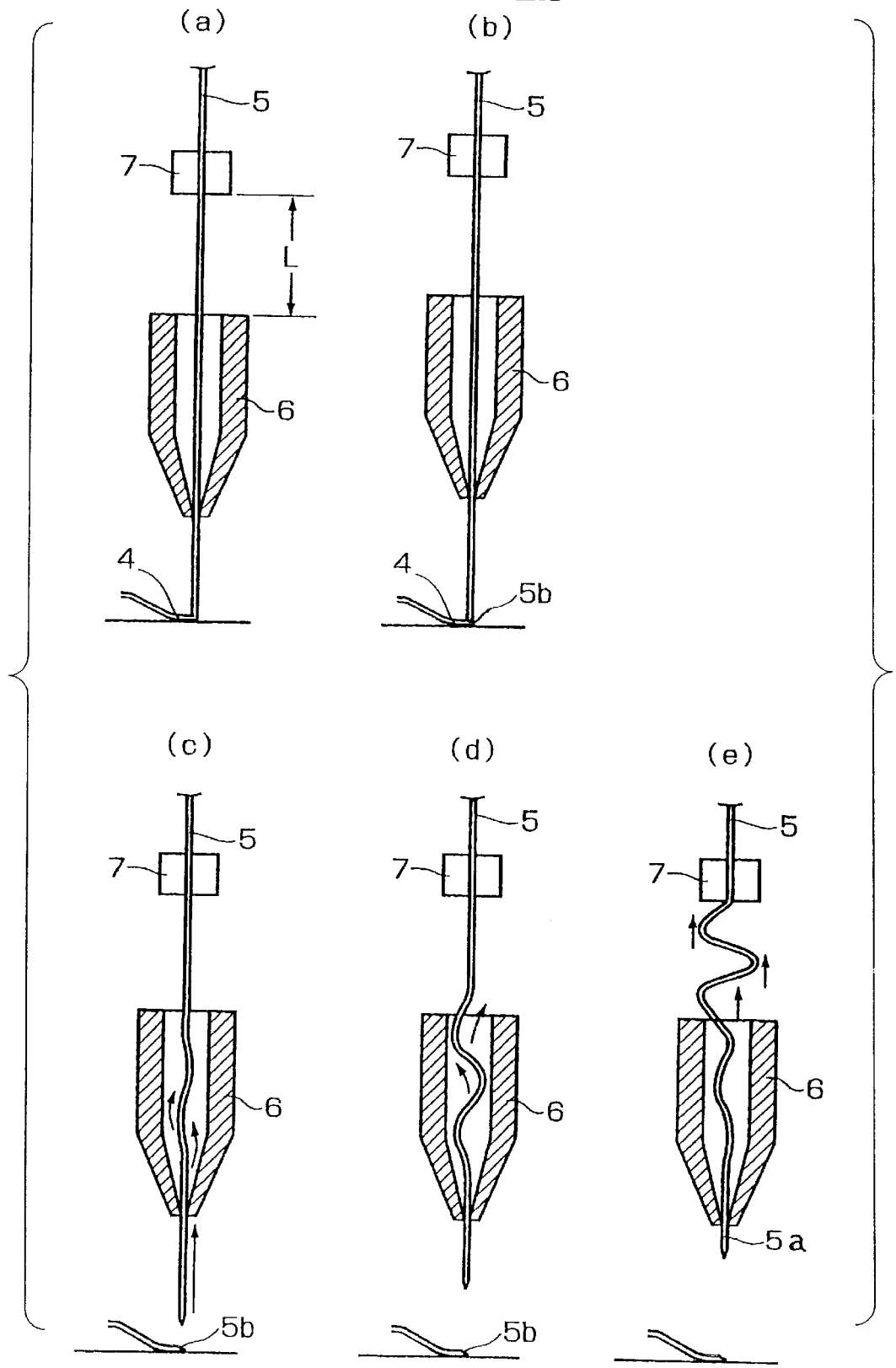
FIG. 4 is a detailed explanatory diagram illustrating the cutting operation of the wire from a second bonding point shown in FIG. 3.

Step (a) in FIG. 1 is the same state as step (c) in FIG. 3 and step (a) in FIG. 4. In other words, in step (a) in FIG. 1, the capillary 6 and clamper 7 have risen together, and the clamper 7 has closed at an intermediate point in this rising motion so that the wire 5 is held by the clamper 7. When from step (a) the capillary 6 and clamper 7 are raised further in step (b), the portion of the wire 5 that is between the bonded root 5b of the second bonding point 4 and the clamper 7 elongates. As a result, the bonded root 5b undergoes plastic deformation, and the wire 5 is cut. When the wire 5 is thus cut from the bonded root 5b, a rebound force is generated in the wire 5 so that the elongated wire 5 extending from the clamper 7 to the lower end of the cut wire 5 tends to return to its original state as in step (c) and (d). However, in the shown embodiment, the distance between the capillary 6 and clamper 7 is almost nil and as small as 1.5 mm or less; accordingly, there is no room in the wire 5 that can deform. Accordingly, as shown in step (e), a force that tends to return the wire 5 toward its lower end is generated, and deformation of the wire is prevented.

Since the rebound force of the wire 5 is reduced, and since the area that allows the deformation in the wire 5 is eliminated, no wire deformation occurs. Since deformation in the wire at the time that the wire is cut is thus eliminated, the shape and length of the tail 5a are consistent, and the shape of a ball that is formed at the end of the wire in the next process becomes consistent. Accordingly, favorable wire bonding can be performed, and the shape of the wire loop can be consistent.

As seen from the above, according to the present invention, in a wire bonding apparatus in which a wire passes through a capillary provided at one end of a bonding arm and a clamper that holds the wire is disposed directly above the capillary, the distance between the upper surface of the capillary and the undersurface of clamper is set as short as 1.5 mm or less. Accordingly, deformation in the wire at the time that the wire is cut is prevented, and the shape and length of the wire tail can be consistent, and consistent shape of wire loops is obtained.

What is claimed is:

1. A wire bonding apparatus comprising a capillary, which is provided at one end of a bonding arm and through which a wire is passed, and a clamper, which holds said wire and is disposed directly above said capillary, wherein a distance between an upper surface of said capillary and an undersurface of said clamper is set at 1.5 mm or less.

2. A wire bonding apparatus comprising a capillary, which is provided at one end of a bonding arm and through which a wire is passed, and a clamper, which holds said wire when closed and is disposed above said capillary so as to be moved up and down together with said capillary, wherein said clamper is provided so that an undersurface thereof is apart from an upper surface of said capillary with a distance that prevents deformation from occurring in said wire when said wire is cut.

3. The wire bonding apparatus according to claim 2, wherein said distance is 0.1–1.0 mm.

* * * * *